United States Patent
Kimura et al.

[11] Patent Number: 6,078,096
[45] Date of Patent: Jun. 20, 2000

[54] SEMICONDUCTOR INTEGRATED CIRCUIT DEVICE HAVING A SHORT CIRCUIT PREVENTING CIRCUIT

[75] Inventors: Tatsuya Kimura, Sakurai; Hidehiko Tanaka, Nara, both of Japan

[73] Assignee: Sharp Kabushiki, Osaka, Japan

[21] Appl. No.: 08/955,016

[22] Filed: Oct. 20, 1997

[30] Foreign Application Priority Data

Mar. 31, 1997 [JP] Japan ................................ 9-079298

[51] Int. Cl.[7] ................. H01L 23/62; H01L 29/00; H01L 29/40; H01L 27/118
[52] U.S. Cl. ................. 257/620; 257/797; 257/355; 257/346; 257/503; 257/723; 257/724
[58] Field of Search ................. 257/799, 211, 257/48, 208, 503, 626, 665, 666, 698, 723, 724, 737, 786, 355, 546; 438/6, 599, 465, 10; 324/73.1, 754, 765; 365/51, 201, 194, 200, 233, 174, 63; 363/56, 98, 147, 37

[56] References Cited

U.S. PATENT DOCUMENTS

| | | | |
|---|---|---|---|
| 3,781,683 | 12/1973 | Freed | 324/158 F |
| 3,839,782 | 10/1974 | Russell | 438/6 |
| 3,983,619 | 10/1976 | Kubo et al. | 438/129 |
| 4,778,771 | 10/1988 | Hiki | 438/6 |
| 4,910,735 | 3/1990 | Yamashita | 371/22.4 |
| 5,138,427 | 8/1992 | Furayama | 257/48 |
| 5,210,041 | 5/1993 | Kobayashi et al. | 438/7 |
| 5,248,936 | 9/1993 | Nakata et al. | 324/73.1 |
| 5,309,011 | 5/1994 | Tazunoki et al. | 257/390 |
| 5,463,249 | 10/1995 | Shinbo et al. | 257/690 |
| 5,696,404 | 12/1997 | Murari et al. | 257/620 |

FOREIGN PATENT DOCUMENTS 2-116159 4/1990 Japan .
4-373169 12/1992 Japan .

*Primary Examiner*—Alexander Oscar Williams
*Attorney, Agent, or Firm*—Morrison & Foerster, LLP

[57] ABSTRACT

A 16 Mbit DRAM of the invention is made up of a nexus of four 4 Mbit DRAM chips which are formed adjacent to one another on the wafer and each constitute an individual 4 Mbit DRAM, the connection between the 4 Mbit DRAMs is formed through a short-circuit protecting circuit provided within each 4 Mbit DRAM and an interconnection/controller circuit portion formed in the dicing area between the 4 Mbit DRAMs. When the nexus is cut along the dicing area containing the interconnection/controller circuit portion, 4 Mbit DRAM chips and/or 8 Mbit DRAM chips can be produced as desired.

7 Claims, 11 Drawing Sheets

7 Interconnection/controller circuit portion for integration 8 16 Mbit DRAM chip 6 4 Mbit DRAM 9 4 Mbit DRAM chip
7
12 Short-circuit protecting circuit
10 8 Mbit DRAM chip 11 Faulty 4 Mbit DRAM
6
7
12
8 ns6,078,096

SEMICONDUCTOR INTEGRATED CIRCUIT DEVICE HAVING A SHORT CIRCUIT PREVENTING CIRCUIT

BACKGROUND OF THE INVENTION (1) Field of the Invention

The present invention relates to a semiconductor integrated circuit device, in particular, relating to an effective technology for semiconductor devices which includes unit semiconductor storage devices in an arbitrary number.

(2) Description of the Prior Art

Conventionally, semiconductor storage devices are produced by forming a number of semiconductor storage devices having an identical capacity on a common wafer. This wafer is cut along dicing lines into pieces, i.e., individual semiconductor storage devices which in turn are packaged into products all having the same capacity.

Most semiconductor storage devices incorporate redundant circuits to some degree, assuming development of deficiency and faults during their manufacturing. Therefore, if a fault etc. develops, the defective portion will be replaced with its backup redundant circuit so that the semiconductor storage device will function normally.

The conventional semiconductor devices, however, suffered from the following problems. For example, in the production of 16 Mbit DRAMs as one type of the semiconductor devices, semiconductor storage devices of single type having an identical capacity (16 Mbits) are provided on a common wafer. Suppose that this 16 Mbit DRAM chip has a 5% redundant circuit ratio therein. In this case, if defects in the circuit or faults during production arise in an amount of 6% of the entire circuit, the chip is assumed as defective even when 94%, the remaining portion of the circuit functions normally, thus degrading production yield and increasing the cost of the chip.

In the case where 8 Mbit DRAMs, 4 Mbit DRAMs etc. are produced from 16 Mbit DRAMs using a designing technique called 'cut-down process' disclosed in Japanese Patent Application Laid-Open Hei 4 No.373,169, needed storage circuits, controller circuits etc. must be diced out from 16 Mbit DRAMs, and then 8 Mbit DRAMs and 4 Mbit DRAMs need to be newly designed and produced. Therefore, this method needed time for designing and production.

SUMMARY OF THE INVENTION

The invention has been achieved in view of the above conventional problems, and it is therefore an object of the present invention to provide a semiconductor integrated circuit device which is improved in its production yield and allows cut-down chips to be formed easily.

In accordance with the first aspect of the invention, a semiconductor integrated circuit device comprises: a nexus of plural unit semiconductor integrated circuits which are formed adjacent to one another on the wafer and each constitute an individual semiconductor integrated circuit device having a predetermined identical function, and is characterized in that the connection between unit semiconductor integrated circuits is made up of a short-circuit protecting circuit (i.e., fuse circuit) provided within each unit semiconductor integrated circuit and an interconnecting circuit formed in the dicing area between the unit semiconductor integrated circuits.

In accordance with the second aspect of the invention, the semiconductor integrated circuit device having the above first configuration is characterized in that the interconnecting circuit formed in the dicing area between unit semiconductor integrated circuits is composed of wires, and each unit semiconductor integrated circuit incorporates an architecture switching circuit for interchanging states where a single unit semiconductor storage device forms an individual semiconductor integrated circuit device and where a nexus of unit semiconductor storage devices forms an individual semiconductor integrated circuit device.

In accordance with the third aspect of the invention, the semiconductor integrated circuit device having the above first configuration is characterized in that the interconnecting circuit formed in the dicing area between unit semiconductor integrated circuits comprises a control circuit which processes the signals outputted from the two unit semiconductor integrated circuits formed on both sides of the dicing area, in a predetermined manner and inputs the processed signals to the unit semiconductor integrated circuits.

In accordance with the fourth through sixth aspects of the invention, a semiconductor integrated circuit device composed of a single or a plurality of the unit semiconductor integrated circuits which are formed by cutting the semiconductor integrated circuit device defined in any of the above first to third configurations, along the dicing area therein.

DESCRIPTION OF THE PREFERRED EMBODIMENTS

The embodiment of the invention will hereinafter be described in detail with reference to the accompanying drawings.

Figure 1:
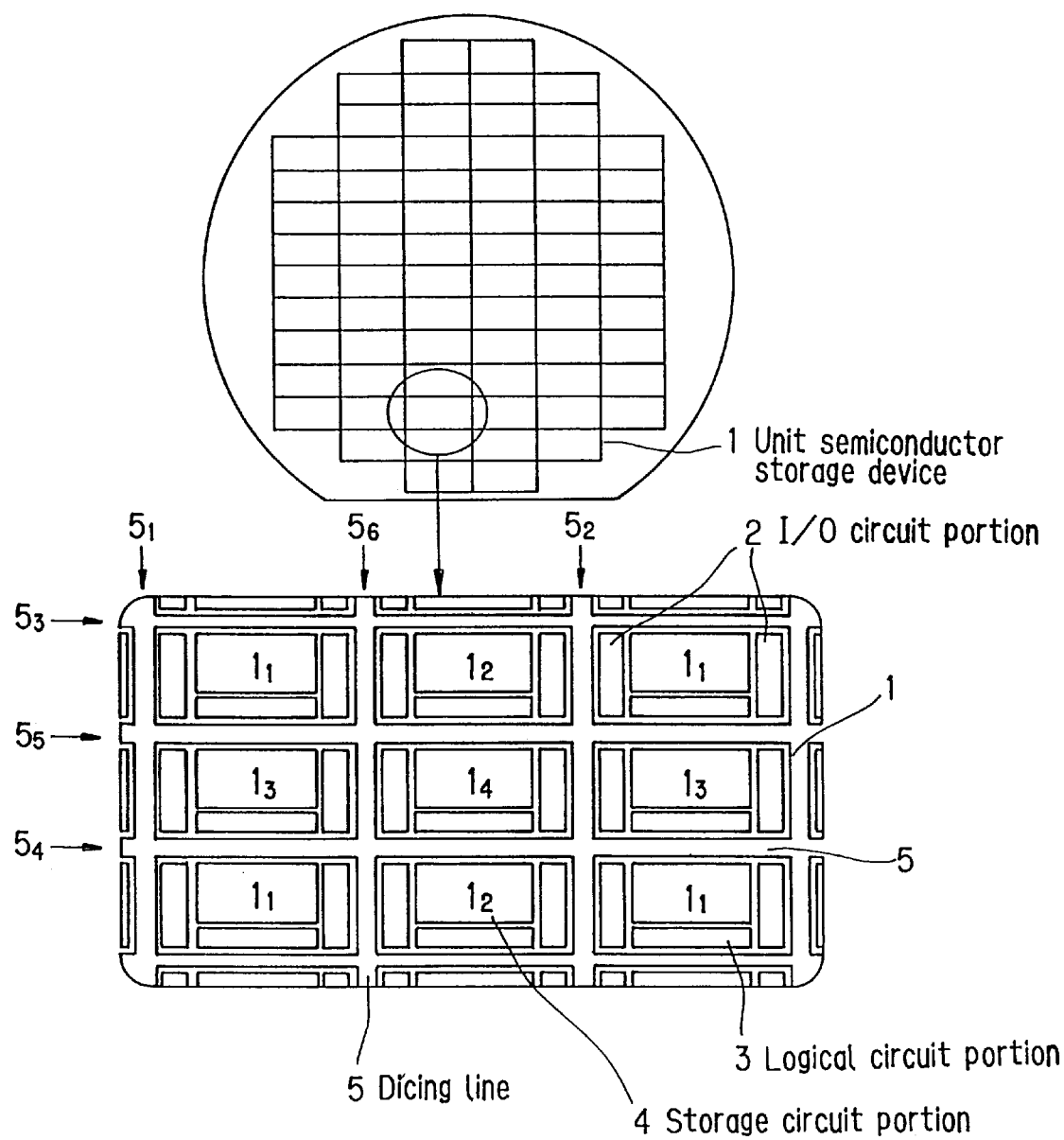
FIGS. 1A and 1B are diagrams showing the principle of a semiconductor integrated circuit device in accordance with the invention.

FIG. 1 is a diagram showing the principle of a semiconductor integrated circuit device of the invention, by exemplifying semiconductor storage devices.

A multiple number of unit semiconductor storage devices 1 are laid out on a wafer. The lower part of the figure is an enlarged view, each unit semiconductor storage device 1 includes an input/output circuit portion 2, a logical circuit portion 3 and a storage circuit portion 4. This wafer includes unit semiconductor storage devices of a single kind, each functioning as an independent semiconductor storage device. Designated at 5 is a dicing line between unit semiconductor storage devices.

In the semiconductor storage device of the invention, for example, four (two by two) unit semiconductor storage devices $1_1$, $1_2$, $1_3$ and $1_4$ form a nexus on the wafer (the number of unit semiconductor storage devices forming the nexus is not limited to four but can be set to an arbitrary integer). The integral of the four unit semiconductor storage devices to be cut out along dicing lines $5_1$, $5_2$, $5_3$ and $5_4$ constitutes a single semiconductor storage device having four times the capacity of unit semiconductor storage device 1. For example, suppose a 16 Mbit DRAM is constituted of the four unit semiconductor storage devices, two 8 Mbit DRAMs will be formed if it is divided along dicing line $5_5$; and two 8 Mbit DRAMs will be formed into four 4 Mbit DRAMs when they are cut along dicing line $5_6$.

The connection between the unit semiconductor storage devices forming a single nexus, is formed by interconnecting circuits formed in the dicing areas between the unit semiconductor storage devices and fuse circuits provided inside each unit semiconductor storage device.

Further, the interconnecting circuits formed in the dicing areas between the unit semiconductor storage devices are made up of wires while each of the unit semiconductor storage devices incorporates an architecture switching circuit for interchanging states where a single unit semiconductor storage device forms an individual structure as a semiconductor storage device and where a nexus of unit semiconductor storage devices forms an individual structure as a semiconductor storage device.

Alternatively, the interconnecting circuit formed in the dicing area between unit semiconductor storage devices may be made up of a controller circuit which performs predetermined processing for signals outputted from the unit semiconductor storage devices provided on both sides of the dicing area and feeds the processed signals to the unit semiconductor storage devices.

Accordingly, if for example, unit semiconductor storage device $1_1$ has a fault etc. and it is impossible for its redundant circuit to reform it as a 16 Mbit DRAM, the conventional 16 Mbit DRAM as a whole would be discarded as defective. The 16 Mbit DRAM of the invention, however, can be diced along dicing lines $5_5$ and $5_6$ to thereby obtain a 4 Mbit DRAM and 8 Mbit DRAM or three 4 Mbit DRAMs so as to reduce the wafer area which will be discarded as defective, thus improving the production yield.

Consequently, in accordance with the invention, since each semiconductor storage device which would have been discarded if it were defective even through most part of it functioned normally, is composed as an integral of an arbitrary number of unit semiconductor storage devices, it is possible to reduce the area of the semiconductor storage devices on the wafer to be discarded as defective and hence improve the production yield of semiconductor storage devices, and further, its cut-down semiconductor storage devices can be obtained.

Figure 2:
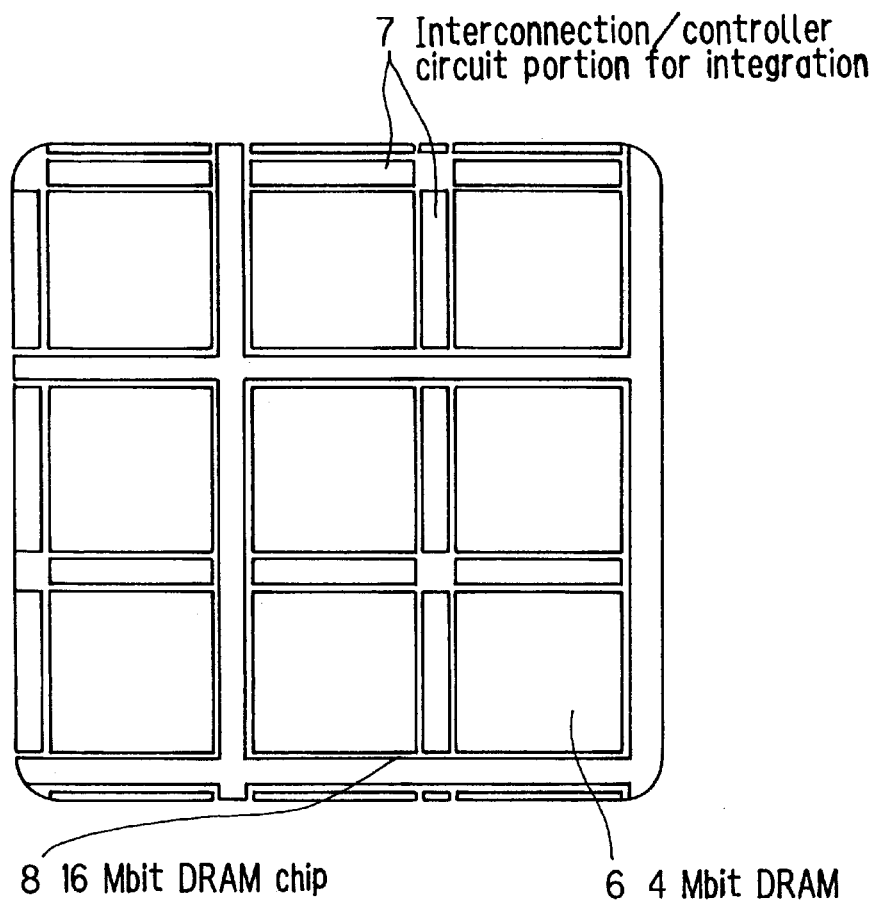
FIG. 2 is a plan view showing a part of a wafer in an embodiment where semiconductor integrated circuit devices are formed of unit semiconductor storage devices having a capacity of 4 Mbits with their maximum capacity being 16 Mbits.

FIG. 2 is a plan view of semiconductor storage devices of the invention, showing a part of its wafer as an embodiment in which unit semiconductor storage devices having a capacity of 4 Mbits are provided with their maximum capacity being 16 Mbits. As seen in this figure, four 4 Mbit DRAMs 6 are integrated in order to construct a 16 Mbit DRAM chip 8. Provided on dicing lines 5 between these 4 Mbit DRAMs are interconnection/controller circuit portions 7 for achieving integration.

Figure 3:
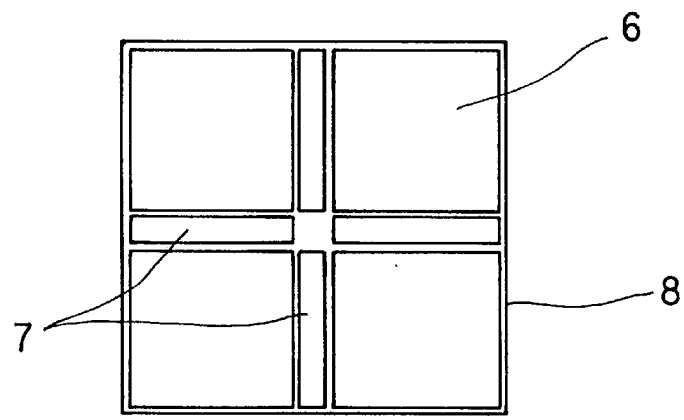
FIG. 3 is a plan view showing a state where a 16 Mbit DRAM chip is formed from the wafer of the same embodiment.

When 16 Mbit DRAM chips need to be produced from this wafer, the dicing lines between 16 Mbit DRAM chips 8 in FIG. 2 are selected to be cut, thus making it possible to produce 16 Mbit DRAM chips 8 as shown in FIG. 3. When 4 Mbit DRAM chips and 8 Mbit DRAM chips need to be produced, the 16 Mbit chip will be cut along the lateral dicing lines containing interconnection/controller circuit portions 7 and along the upper half of the longitudinal dicing line within the 16 Mbit DRAM, thus making it possible to produce two 4 Mbit DRAM chips 9 and 9 and an 8 Mbit DRAM chip 10. Further, when 8 Mbit DRAM chip 10 is cut down along the dicing line containing interconnection/ controller circuit portions 7 between the two 4 Mbit DRAMs, obviously four 4 Mbit DRAM chips 9 can be produced.

Figure 4:
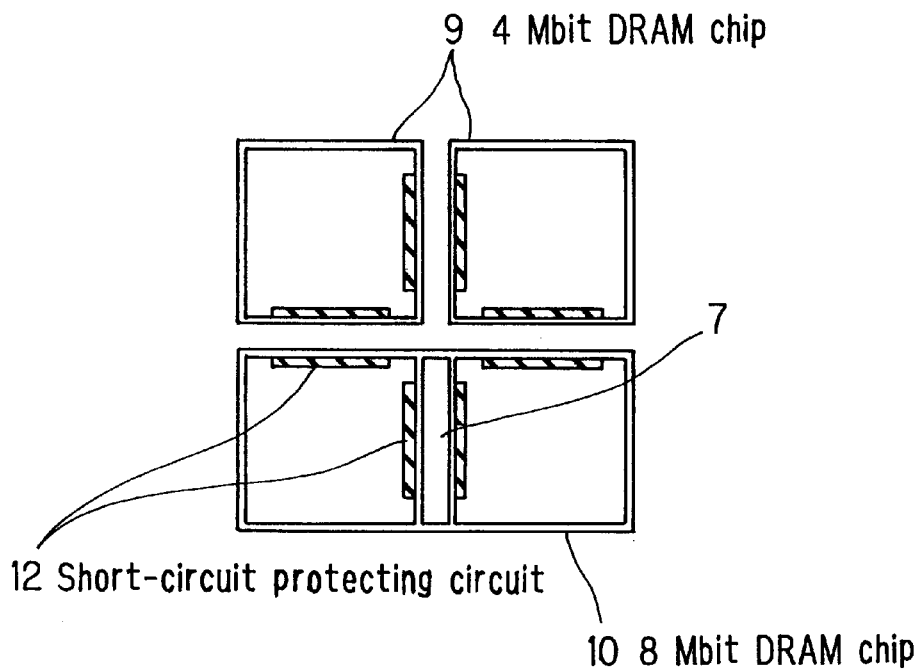
FIG. 4 is a plan view showing a state where two 4 Mbit DRAMs and one 8 Mbit DRAM are produced from the wafer of the same embodiment.

In this way, in this invention, since the wafer is cut down along dicing lines containing interconnection/control circuitry portions between unit semiconductor storage devices to form semiconductor storage devices of smaller capacities, there is a high risk that the wires may accidentally come in contact during cutting causing short circuits. To avoid this, as shown in FIG. 4, short-circuit protecting circuits 12 are provided on the peripheral sides of each of the unit semiconductor storage devices (4 Mbit DRAMs). This short-circuit protecting circuit 12 can be made up of fuse circuits, for example. That is, when a dicing line formed with interconnection/control circuit portion 7 is cut, a fuse circuit provided corresponding to the cut dicing line is also cut so that, even if short circuit occurs due to the cutting of the dicing line, the cut fuse can separate the interior circuit of each unit semiconductor storage device from the short-circuited portion, thus preventing the occurrence of faults.

Figure 5:
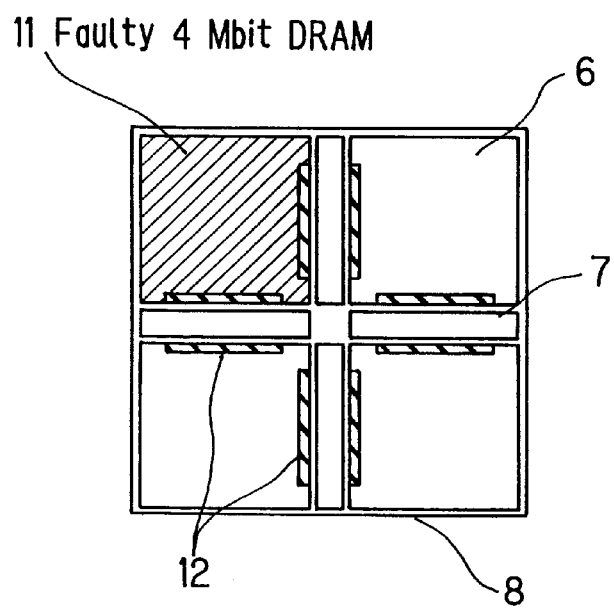
FIG. 5 is a plan view showing a state where the upper left 4 Mbit DRAM as a part of a 16 Mbit DRAM is defective in the same embodiment.
Figure 6:
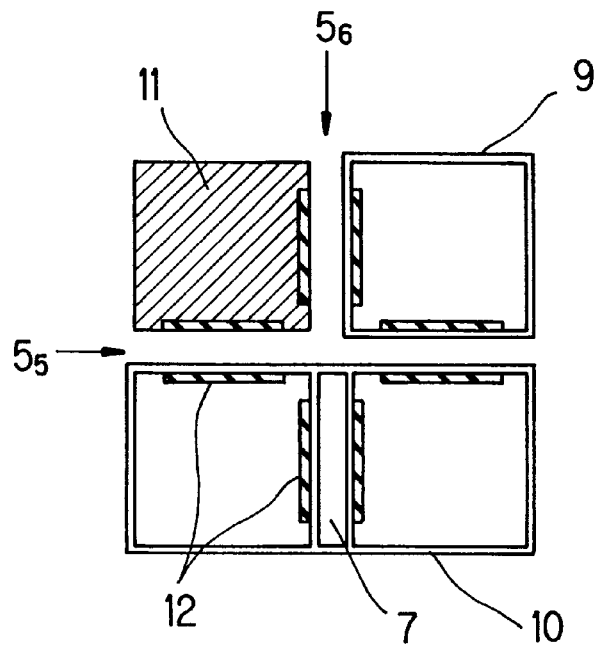
FIG. 6 is a plan view showing a state where a 4 Mbit DRAM and an 8 Mbit DRAM are formed from the remaining portion other than the defective 4 Mbit DRAM of FIG. 5.
Figure 7:
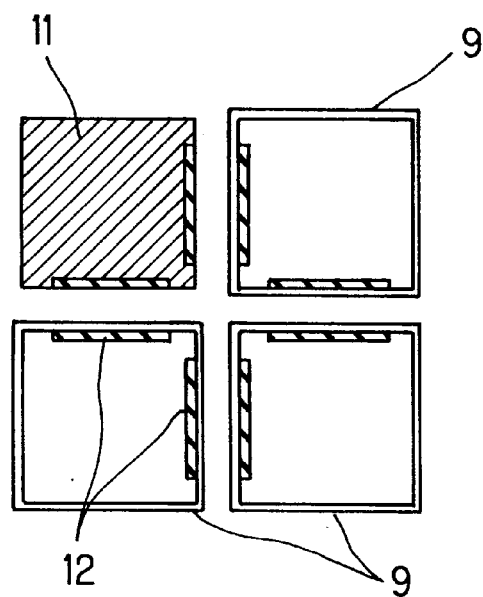
FIG. 7 is plan view showing a state where three 4 Mbit DRAMs are formed from the remaining portion other than the defective 4 Mbit DRAM of FIG. 5.

In the conventional configuration, when, for example, a 16 Mbit DRAM has a defective unit semiconductor storage device (4 Mbit DRAM) 11 as shown in FIG. 5 and cannot be reformed by the redundant circuit, 16 Mbit DRAM chip 8 as a whole is discarded as defective. However, in accordance with the semiconductor storage device of the invention, as shown in FIG. 6, a 4 Mbit DRAM chip 9 and 8 Mbit DRAM chip 10 can be obtained by cutting off the defective chip along dicing lines $5_5$ and $5_6$. Further, when cutting as shown in FIG. 7, three 4 Mbit DRAM chips 9, 9 and 9 can be obtained. Thus, it is possible to reduce the wafer area which will be discarded as defective and hence improve the production yield.

Figure 8:
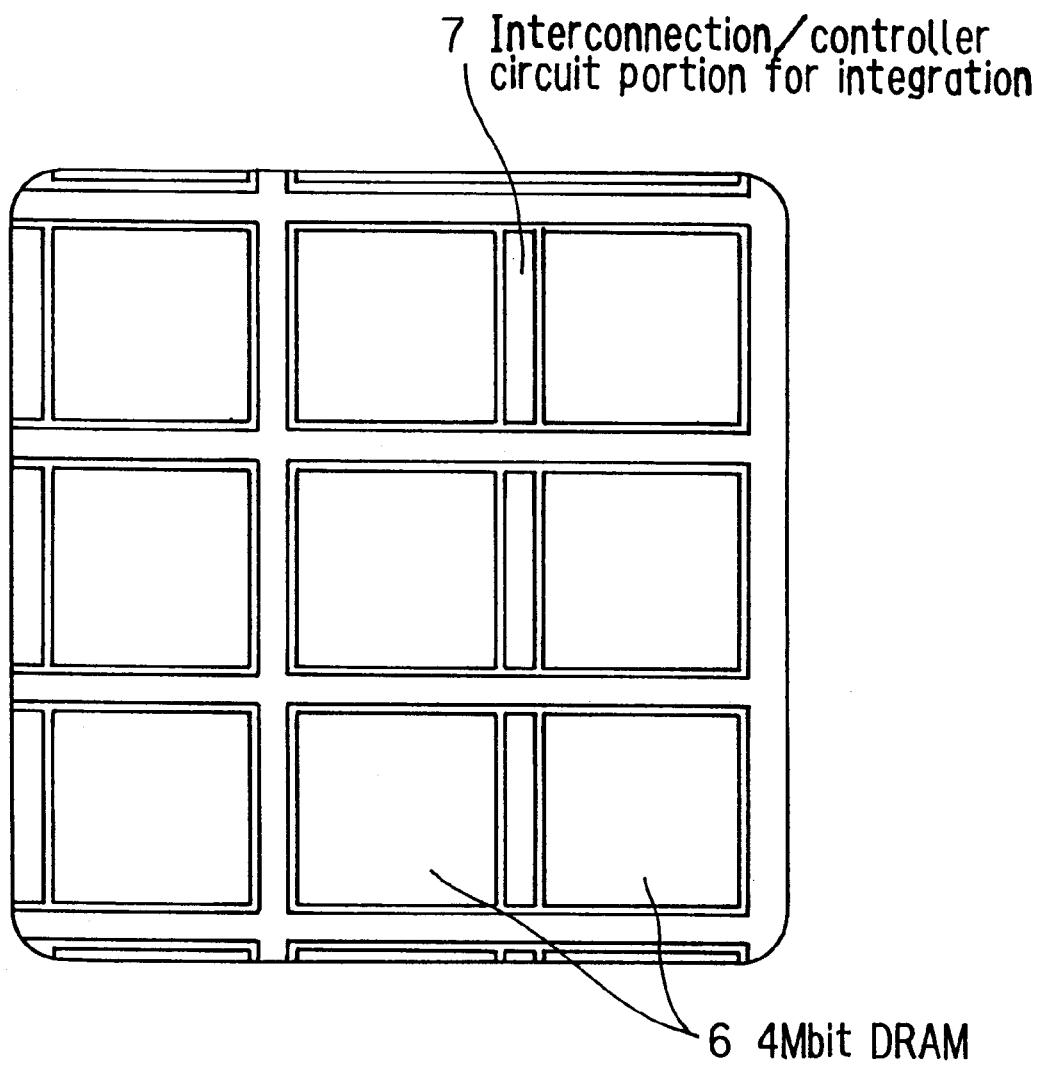
FIG. 8 is a plan view showing a part of a wafer in an embodiment where semiconductor integrated circuit devices are formed of unit semiconductor storage devices having a capacity of 4 Mbits with their maximum capacity being 8 Mbits.
Figure 9:
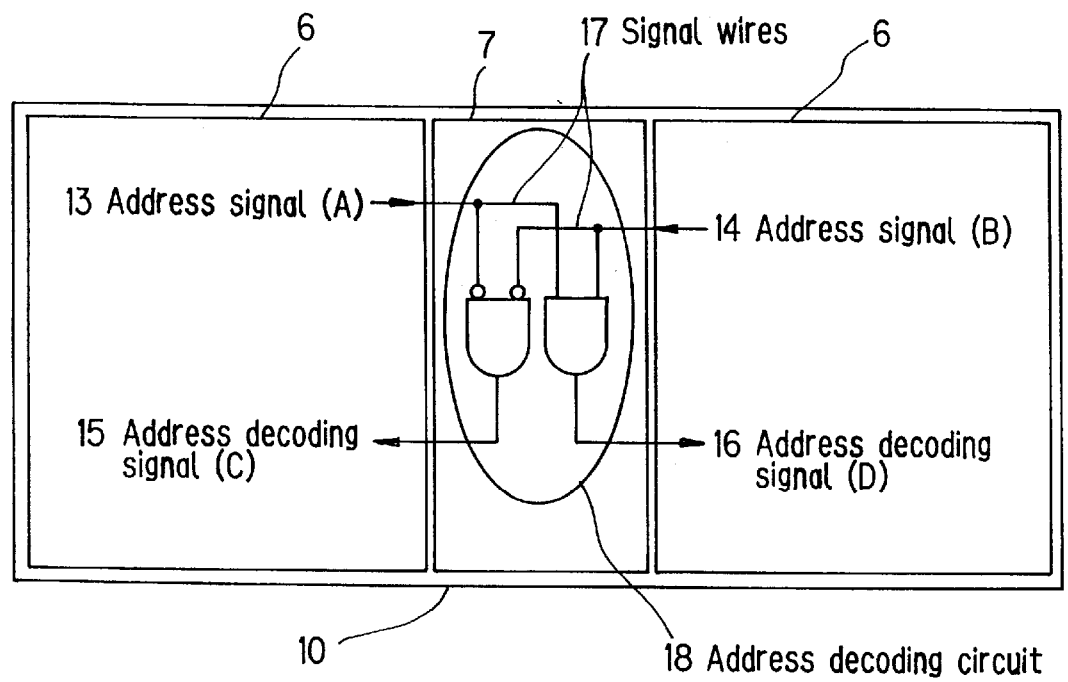
FIG. 9 is a diagram showing a configurational example of an interconnection/controller circuit portion formed in the dicing area of the same embodiment.
Figure 10:
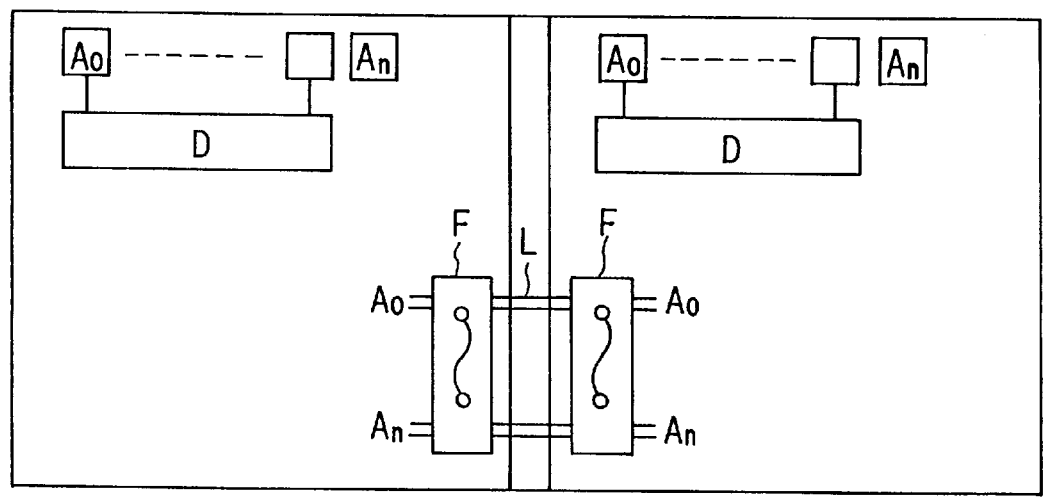
FIG. 10 is a block diagram showing a part of the internal configuration of each 4 Mbit DRAM in the same embodiment.

Next, description will be made of the interconnection/controller circuit portion 7 provided on the dicing line. FIG. 9 is a diagram showing one of the configurational examples. FIG. 9 shows a configurational example where two unit semiconductor storage devices (4 Mbit DRAMs) 6, 6 arranged in the lateral direction as shown in FIG. 8 form one nexus. Specifically, this circuit portion includes signal wires 17 and address decoding circuit 18, forming a processing circuit for processing the most significant address bit signal to be added to when two 4 Mbit DRAMs are integrated into an 8 Mbit DRAM. Here, as shown in FIG. 10, each 4 Mbit DRAM as a component of the nexus has address signal input terminals $A_0$ to $A_n$ required for an 8 Mbit DRAM, and further, corresponding terminals of two 4 Mbit DRAMs are connected through wires L formed in the dicing area and fuse circuits F formed inside each 4 Mbit DRAM. Accordingly, the address terminals of the package may and should be connected to the terminals of any of the 4 Mbit DRAMs. Here, although unillustrated, the data input/output terminals as well as the input terminals for various control signals are also formed in the required number for each 4 Mbit DRAM, and corresponding terminals of the 4 Mbit DRAMs are connected via wires formed in the dicing area and fuse circuits formed inside each 4 Mbit DRAM, in a similar manner as above.

An address signal (A) 13 and address signal (B) 14 in FIG. 9, each represent the most significant address bit signal $A_n$ output from the corresponding 4 Mbit; DRAM and are identical in signal level. Designated at 18 is an address decoding circuit which receives the above signals and outputs an address decoding signal (C) 15 and an address decoding signal (D) 16. If the input most significant address bit signal $A_n$ is at the H-level, address decoding signal (D) 16 input to the right-hand 4 Mbit DRAM becomes HIGH while address decoding signal (C) 15 input to the left-hand 4 Mbit DRAM becomes LOW. Conversely, if the input most significant address bit signal $A_n$ is at the L-level, address decoding signal (D) 16 input to the right-hand 4 Mbit DRAM becomes LOW while address decoding signal (C) 15 input to the left-hand 4 Mbit DRAM becomes HIGH. Decoder circuit D inside each 4 Mbit DRAM is configured to decode the remaining address signals $A_0$ to $A_{n-1}$ except the most significant bit, and its state of operation, i.e., whether the decoder is activated or deactivated, is adapted to be controlled by the aforementioned address decoding signal 15 or 16. Illustratively, when the input address decoding signal is at the H-level, the decoder becomes activated so as to output a decoding signal based on the input address signal, whereas, when the input address decoding signal is at the L-level, the decoder becomes deactivated so not as to output any decoding signal. Accordingly, in the case where an 8 Mbit DRAM is formed, when the most significant address bit signal is HIGH, the right-hand 4 Mbit DRAM will be selected, whereas when the most significant address bit signal is LOW, the left-hand 4 Mbit DRAM will be selected.

Figure 11:
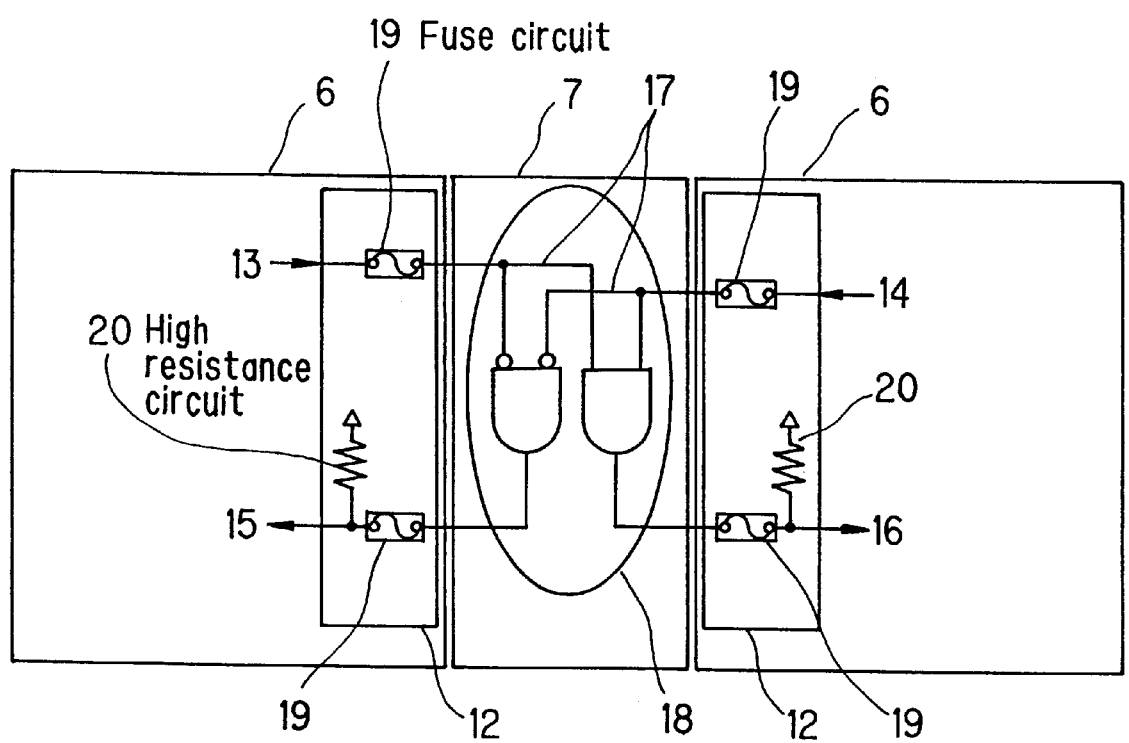
FIG. 11 is a diagram showing a configurational example of an interconnection/controller circuit portion formed in the dicing area and a short-circuit protecting circuit formed inside each 4 Mbit DRAM in the same embodiment.

FIG. 11 is a configurational diagram showing an interconnection/controller circuit portion including a short-circuit protecting circuit 12 inside each 4 Mbit DRAM. Short-circuit protecting circuit 12 includes fuse circuits 19 and a high-resistance circuit 20 for level setup in the case of the fuse being in the cut off state. The operation when an 8 Mbit DRAM chip is formed is as that described above. On the other hand, when two 4 Mbit DRAMs are formed by cutting the dicing line containing interconnection/controller circuit portion 7, the fuses inside short-circuit protecting circuits 12 are cut. This sets both address decoding signal (C) 15 and address decoding signal (D) 16 at the H-level so that either of the 4 Mbit DRAM chips operate normally (when they are not defective). In this case, all the fuses provided in the connecting paths between the address terminals etc. are also cut.

Figure 12:
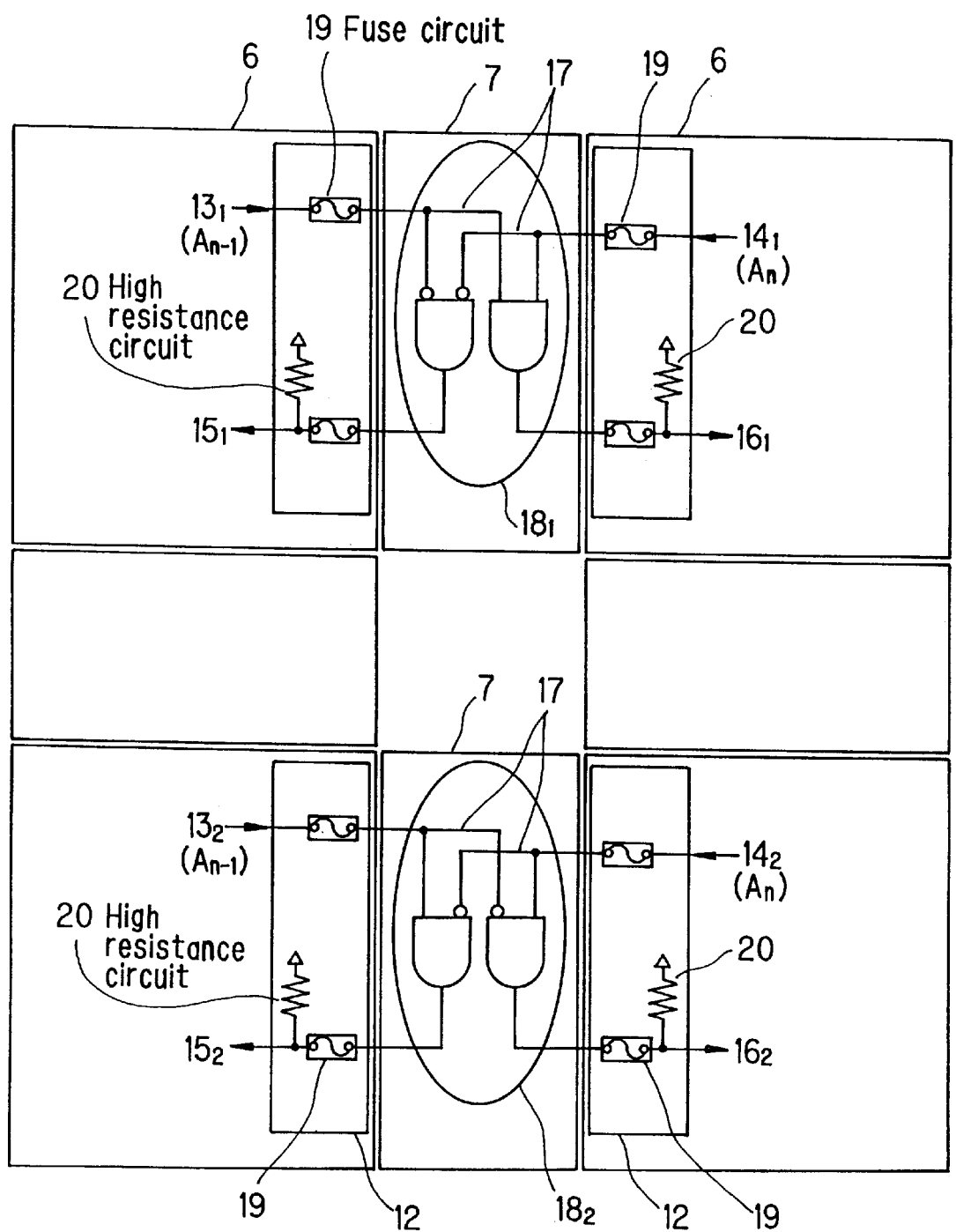
FIG. 12 is a diagram showing a configurational example of an interconnection/controller circuit portion formed in the dicing area and a short-circuit protecting circuit formed inside each 4 Mbit DRAM, in the embodiment shown in FIG. 2.
Figure 13:
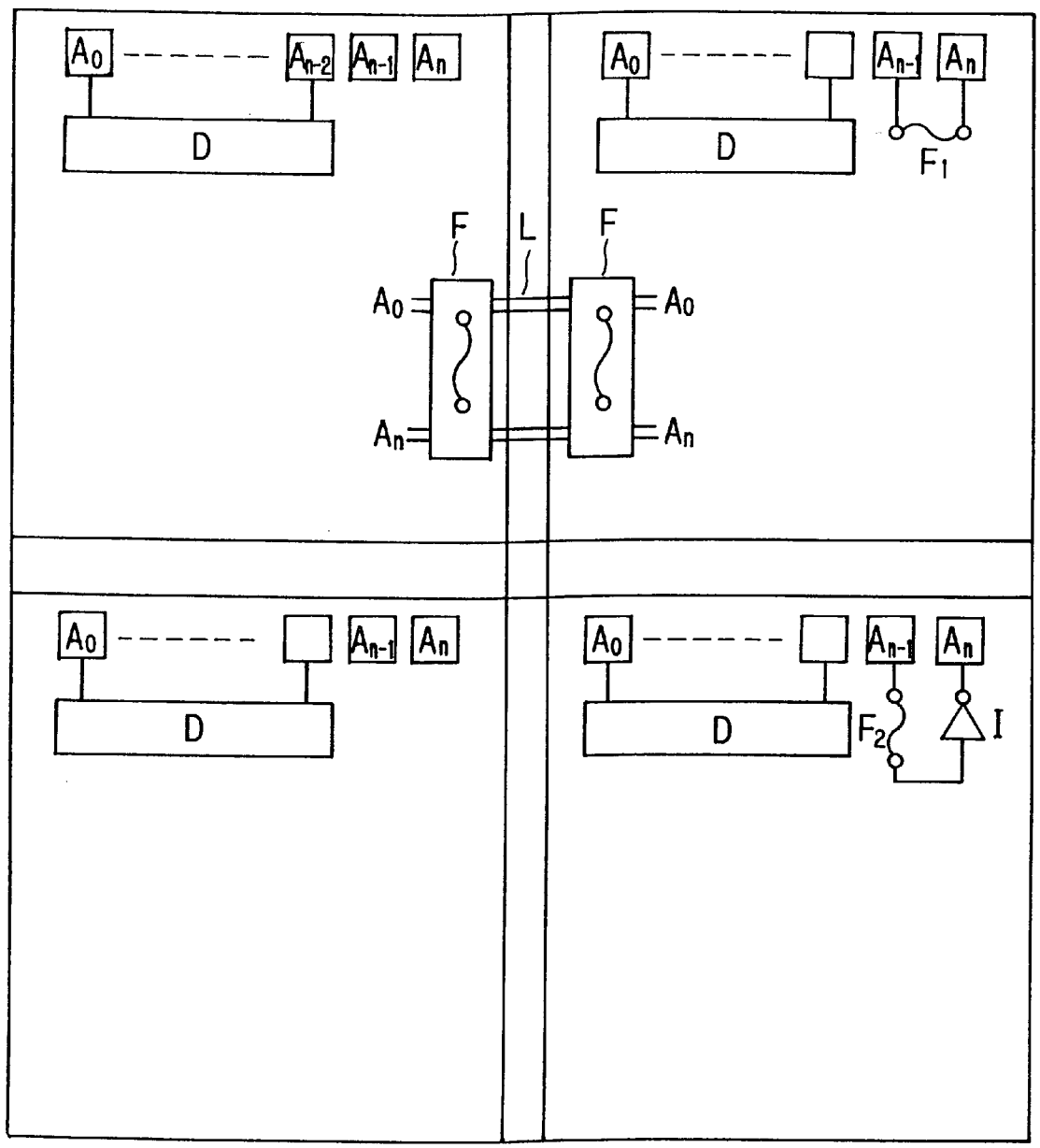
FIG. 13 is a block diagram showing a part of the internal configuration of each 4 Mbit DRAM in the same embodiment.

FIG. 12 is a diagram showing another configurational example of interconnection/controller circuit portions 7. FIG. 12 is a configurational example when as shown in FIG. 2, four unit semiconductor storage devices (4 Mbit DRAMs) 6,6,6 and 6 are arranged as two in the longitudinal direction and as two in the transverse direction (two by two) forming a nexus. Illustratively, this is the processing circuit for processing, the second most significant address bit signal $A_{n-1}$ to be added to when two 4 Mbit DRAMs are joined into an 8 Mbit DRAM, and the most significant address bit signal $A_n$ to be added to when two 8 Mbit DRAMs are joined into a 16 Mbit DRAM. Similar to the above example, this circuit portion includes signal wires 17 and address decoding circuit $18_1$ or $18_2$. Here, as shown in FIG. 13, each 4 Mbit DRAM as a component of the nexus has address signal input terminals $A_0$ to $A_n$ required for a 16 Mbit DRAM, and further, corresponding terminals of the four 4 Mbit DRAMs are connected via wires L formed in the dicing areas and fuse circuits F formed inside each 4 Mbit DRAM. Here, shown in the figure are only the wires and fuse circuits for the upper right 4 Mbit DRAM and the upper left 4 Mbit DRAM, but similar wires and fuse circuits are also provided between the lower right 4 Mbit DRAM, and each of the upper right and the lower left 4 Mbit DRAMs. Further, a fuse circuit $F_1$ is interposed between address terminals $A_n$ and $A_{n-1}$ in the upper right 4 Mbit DRAM. Address terminals $A_n$ and $A_{n-1}$ in the lower right 4 Mbit DRAM are connected through a fuse circuit $F_2$ and an inverter I. Here, although unillustrated, the data input/output terminals as well as the input terminals for various control signals are also formed in the required number for each 4 Mbit DRAM, and corresponding terminals of the 4 Mbit DRAMs are connected via wires formed in the dicing areas and fuse circuits formed inside each 4 Mbit DRAM, in a similar manner as above.

An address signal $13_1$ and an address signal $14_1$ in FIG. 12, represent the second most significant address bit signal $A_{n-1}$ and the most significant address bit signal $A_n$ output from respective 4 Mbit DRAMs. Designated at $18_1$ is an address decoding circuit which receives the above two signals and outputs an address decoding signal $15_1$ and address decoding signal $16_1$. If the input two address bit signals are both at the H-level, address decoding signal $16_1$ input to the right-hand 4 Mbit DRAM becomes HIGH while address decoding signal $15_1$ input to the left-hand 4 Mbit DRAM becomes LOW. Conversely, if the input two address bit signals are both at the L-level, address decoding signal $16_1$ input to the right-hand 4 Mbit DRAM becomes LOW while address decoding signal $15_1$ input to the left-hand 4 Mbit DRAM becomes HIGH. Decoder circuit D inside each 4 Mbit DRAM is configured to decode the remaining address signals $A_0$ to $A_{n-2}$ except the most and second most significant bits, and its state of operation, i.e., whether the decoder is activated or deactivated, is adapted to be controlled by the aforementioned address decoding signal $15_1$ or $16_1$. Illustratively, when the input address decoding signal is at the H-level, the decoder becomes activated so as to output a decoding signal based on the input address signal, whereas, when the input address decoding signal is at the L-level, the decoder becomes deactivated so not as to output any decoding signal.

An address signal $13_2$ and address signal $14_2$ in FIG. 12, represent the second most significant address bit signal $A_{n-1}$ and the most significant address bit signal $A_n$ output from respective 4 Mbit DRAMs. Designated at $18_2$ is an address decoding circuit which receives the above two signals and outputs an address decoding signal $15_2$ and address decoding signal $16_2$. If the input most and second most significant address bits are at the H-level and L-level, respectively, address decoding signal $16_2$ input to the right-hand 4 Mbit DRAM becomes HIGH while address decoding signal $15_2$ input to the left-hand 4 Mbit DRAM becomes LOW. Conversely, if the input most and second most significant address bits are at the L-level and H-level, respectively, address decoding signal $16_2$ input to the right-hand 4 Mbit DRAM becomes LOW while address decoding signal $15_2$ input to the left-hand 4 Mbit DRAM becomes HIGH. Decoder circuit D inside each 4 Mbit DRAM is configured to decode the remaining address signals $A_0$ to $A_{n-2}$ except the most and second most significant bits, and its state of operation, i.e., whether the decoder is activated or deactivated, is adapted to be controlled by the aforementioned address decoding signal $15_2$ or $16_2$. Illustratively, when the input address decoding signal is at the H-level, the decoder becomes activated so as to output a decoding signal based on the input address signal, whereas, when the input address decoding signal is at the L-level, the decoder becomes deactivated so not as to output any decoding signal.

In the case where a 16 Mbit DRAM is formed, a fuse $F_1$ between terminals $A_n$ and $A_{n-1}$ in the upper right 4 Mbit DRAM and a fuse $F_2$ between terminals $A_n$ and $A_{n-1}$ in the lower right 4 Mbit DRAM are cut. Therefore, in the occasion of a 16 Mbit DRAM chip being formed, when the most and second most significant address bit signals are both HIGH, the upper right 4 Mbit DRAM will be selected; when the most and second most significant address bit signals are HIGH and LOW, respectively, the lower right 4 Mbit DRAM will be selected; when the most and second most significant address bit signals are LOW and HIGH respectively, the lower left 4 Mbit DRAM will be selected; and when the most and second most significant address bit signals are both LOW, the upper left 4 Mbit DRAM will be selected.

When two 8 Mbit DRAM chips are formed bar cutting the 16 Mbit DRAM along the lateral dicing line therein, all the fuses in the fuse circuits provided in the connecting paths between the address terminals, the connecting paths between the data terminals, and the connecting path between control terminals, of the upper right and lower right 4 Mbit DRAMs are cut. In this case, fuses $F_1$ and $F_2$ between the address terminals will not be cut. In this setting, in any of the upper or lower 8 Mbit DRAM chip, either the right-hand or the left-hand 4 Mbit DRAM is selected in accordance with the level of address signal $A_{n-1}$.

Further, when four 4 Mbit DRAM chips are formed by cutting the longitudinal dicing line, all the uses in the fuse circuits provided in the connecting paths between the address terminals, the connecting paths between the data terminals, and the connecting path between control terminals, of the 4 Mbit DRAMs are cut while the fuses in each short-circuit protecting circuit 12 are all cut. This causes the address decoding signals for all 4 Mbit DRAM chips to be HIGH, enabling each 4 Mbit DRAM to operate normally.

The case where two 4 Mbit DRAM chips and one 4 Mbit DRAM chip are formed is also realized in a similar manner, so that the detailed description will be omitted.

In the embodiment described above, the interconnection/controller circuit portions described above are provided for on the dicing lines, but it is also possible to provide the controller circuit relating to the joining and separation within each unit semiconductor storage device. This configuration will be described next as the second embodiment.

Figure 14:
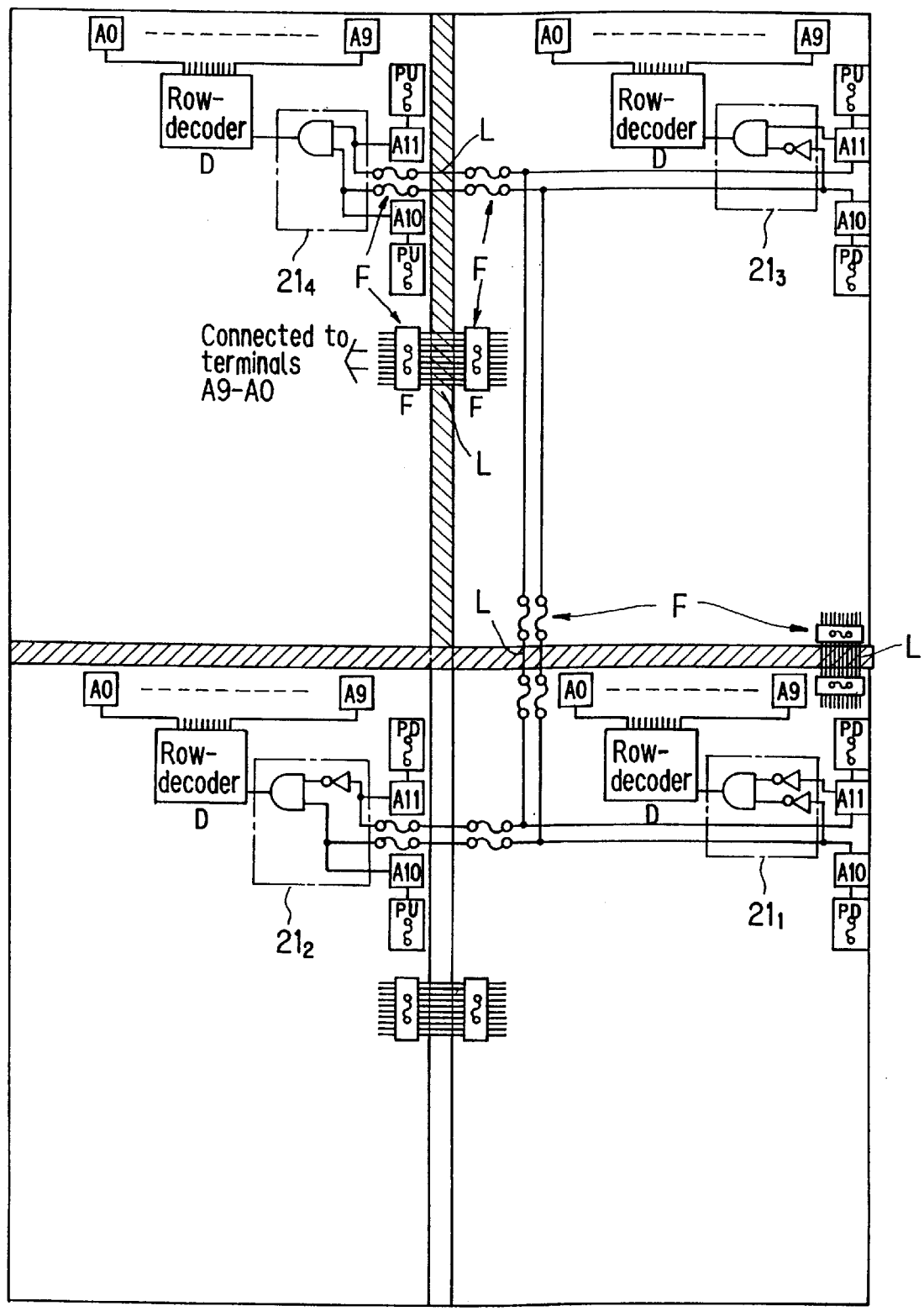
FIG. 14 is a block diagram showing another embodiment of the invention.
Figure 15:
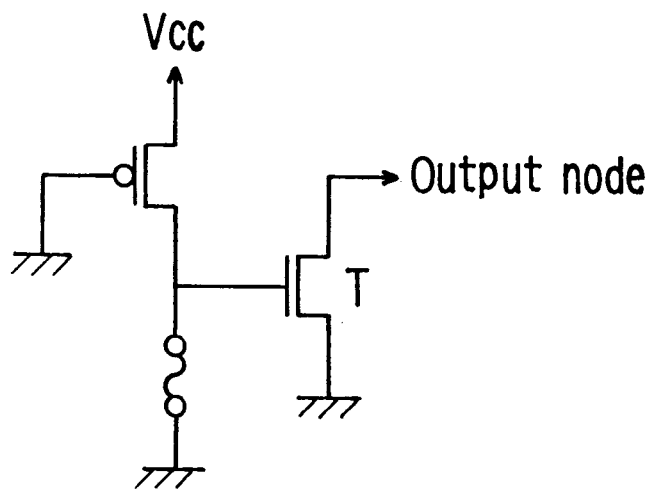
FIG. 15 is a diagram of a pull-down circuit shown in FIG. 14.
Figure 16:
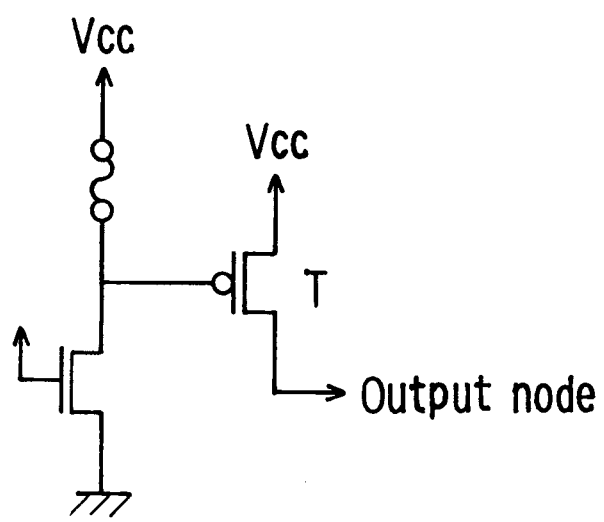
FIG. 16 is a diagram of a pull-up circuit shown in FIG. 14.

FIG. 14 is a block diagram showing the second embodiment. FIGS. 15 and 16 are diagrams showing a pull-down circuit PD and pull-up circuit PU shown in FIG. 14. In the pull-down circuit shown in FIG. 15, if the fuse is not cut, the gate of output transistor T is set at the L-level so that the output node is set into the Hi-Z state. On the other hand, if the fuse is cut, the gate of output transistor T is set at the H-level so that the output node is set into the L-level state. In the pull-up circuit shown in FIG. 16, if the fuse is not cut, the gate of output transistor T is set at the H-level so that the output node is set into the Hi-Z state. On the other hand, if the fuse is cut, the gate of output transistor T is set at the L-level so that the output node is set into the H-level state.

The difference of this embodiment from the first embodiment resides in the circuit generating signals for activating and deactivating the decoder circuit. That is, the circuit is adapted to be incorporated within each unit semiconductor storage device.

A decoder circuit $21_1$ of the lower right unit semiconductor storage device is configured to output a decoder activating signal when the most significant and second most significant address bit signals $A_{11}$ and $A_{10}$ are both at the L-level; a decoder circuit $21_2$ of the lower left unit semiconductor storage device is configured to output a decoder activating signal when the most significant and second most significant address bit signals $A_{11}$ and $A_{10}$ are LOW and HIGH, respectively; a decoder circuit $21_3$ of the upper right unit semiconductor storage device is configured to output a decoder activating signal when the most significant and second most significant address bit signals $A_{11}$ and $A_{10}$ are HIGH and LOW, respectively; and a decoder circuit $21_4$ of the upper left unit semiconductor storage device is configured to output a decoder activating signal when the most significant and the second most significant address bit signals $A_{11}$ and $A_{10}$ are both in the H-level state.

When the four unit semiconductor storage devices as a whole constitute a single semiconductor storages device, no fuses inclusive of the fuses in the pull-down circuits and the pull-up circuits will be cut. In this configuration, the upper two bits of an address signal will selects one of the unit semiconductor storage devices, and the lower part of the address signal further selects a memory cell or a group of memory cells in the selected unit semiconductor storage device. Here, in this case, there will be four terminals which involve the input and output of a common signal, but since the terminals are connected to one another in the interior of the nexus, each terminal of the package only needs to be connected to a terminal corresponding to one of the unit semiconductor storage devices.

In the case of producing two semiconductor storage devices each constituted of a single unit semiconductor storage device and one semiconductor storage device constituted of two unit semiconductor storage devices, the integrated chip is cut down along the hatched area in FIG. 14. Further, fuses F contained in the address terminal connecting path and the fuses contained in the data terminal connecting path and control terminal connecting path although they are not illustrated, residing between the upper right unit semiconductor storage device and each of the lower right and upper left unit semiconductor storage devices, are all cut. In this case, the fuses in the address terminal connecting path etc. between the lower right and lower left unit semiconductor storage devices will not be cut. Also, the fuses inside pull-down circuit PD and pull-up circuit PU contained in each of the upper right and upper left unit semiconductor storage devices are cut. By this setting, the outputs from the decoder control circuit in the upper right and upper left unit semiconductor storage devices are always set at the H-level. On the other hand, the fuse in pull-down circuit PD connected to the most significant address bit signal input terminal $A_{11}$ in each of the lower right and lower left unit semiconductor storage devices is cut. By this setting, the decoder control signal for one of the lower right or lower left unit semiconductor storage device will be set at the H-level in accordance with the level of address bit signal $A_{10}$.

Moreover, in the case of producing four semiconductor storage devices each constituted of one unit semiconductor storage device, in addition to the above cutting steps, thee nexus of the lower left and right unit semiconductor storage devices is cut along the dicing line therebetween and further all the fuses in the address terminal connecting path etc. between the unit semiconductor storage devices are cut. Also the fuses in the remaining pull-down circuits and pull-up circuits are cut. By this procedure, the output from the decoder control circuit in each of the four unit semiconductor storage devices is always set at the H-level.

As described in detail heretofore, the semiconductor integrated circuit device of the invention includes: a plurality of unit semiconductor integrated circuits which are formed adjacent to one another on the wafer and each constitute an individual semiconductor integrated circuit device having a predetermined identical function, and is characterized in that the connection between unit semiconductor integrated circuits is made up of a short-circuit protecting circuit provided within each unit semiconductor integrated circuit and a connecting circuit formed in the dicing area between the unit semiconductor integrated circuits. Further, the semiconductor integrated circuit device of the invention is composed of a single or a plurality of the unit semiconductor integrated circuits which are formed by cutting the above semiconductor integrated circuit device along the dicing area therein. In accordance with the semiconductor integrated circuit device of the invention, it is possible to produce fully functioning semiconductor integrated circuit devices from a partly faulty product which was discarded as a defective in the conventional art, thus achieving an improved production yield. Further, since it is possible to integrate an arbitrary number of unit semiconductor integrated circuits, it is possible to make use of a single wafer regardless of the integrating dimensions, without the necessity of using the cut-down designing method which needs chip designing for each integrated dimension or without necessity of preparing an exposure mask for production. Accordingly, it is possible to perform production under master wafer control which was impossible in the manufacture of conventional semiconductor integrated circuit devices.

What is claimed is:

1. A semiconductor integrated circuit device comprising: a nexus of plural unit semiconductor integrated circuits which are formed adjacent to one another on the wafer and each constitute an individual semiconductor integrated circuit device having a predetermined identical function, characterized in that the connection between unit semiconductor integrated circuits is made up of a short-circuit preventing circuit provided within each unit semiconductor integrated circuit and an interconnecting circuit formed in the dicing area between the unit semiconductor integrated circuits; wherein said unit semiconductor integrated circuit is provided with said dicing area which is disposed on peripheral sides of said circuit, and said circuit is further provided with said short-circuit preventing circuit for preventing short circuit by cutting said unit semiconductor integrated circuit along said dicing area.

2. The semiconductor integrated circuit device according to claim 1, wherein the interconnecting circuit formed in the dicing area between unit semiconductor integrated circuits is composed of wires, and each unit semiconductor integrated circuit incorporates an architecture switching circuit for interchanging states where a single unit semiconductor storage device forms an individual semiconductor integrated circuit device and where a nexus of unit semiconductor storage devices forms an individual semiconductor integrated circuit device.

3. The semiconductor integrated circuit device according to claim 1, wherein the interconnecting circuit formed in the dicing area between unit semiconductor integrated circuits comprises a control circuit which processes the signals outputted from the two unit semiconductor integrated circuits formed on both sides of the dicing area, in a predetermined manner and inputs the processed signals to the unit semiconductor integrated circuits.

4. A semiconductor integrated circuit device composed of a single or a plurality of the unit semiconductor integrated circuits which are formed by cutting the semiconductor integrated circuit device defined in claim 1 along the dicing area therein.

5. A semiconductor integrated circuit device composed of a single or a plurality of the unit semiconductor integrated circuits which are formed by cutting the semiconductor integrated circuit device defined in claim 2 along the dicing area therein.

6. A semiconductor integrated circuit device composed of a single or a plurality of the unit semiconductor integrated circuits which are formed by cutting the semiconductor integrated circuit device defined in claim 3 along the dicing area therein.

7. The semiconductor integrated circuit device according to claim 1, wherein said unit semiconductor integrated circuit comprises a memory chip with unit capacity.

* * * * *